United States Patent
Suzuki et al.

(10) Patent No.: US 8,456,183 B2
(45) Date of Patent: Jun. 4, 2013

(54) ELECTRONIC COMPONENT CONTACTOR, APPARATUS FOR TESTING ELECTRONIC COMPONENT, AND METHOD FOR TESTING ELECTRONIC COMPONENT

(75) Inventors: Shigeru Suzuki, Kanagawa (JP); Shingo Yanagihara, Kanagawa (JP); Keiki Koike, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 264 days.

(21) Appl. No.: 13/051,657

(22) Filed: Mar. 18, 2011

(65) Prior Publication Data

US 2011/0227594 A1     Sep. 22, 2011

(30) Foreign Application Priority Data

Mar. 19, 2010   (JP) .................................. 2010-064426

(51) Int. Cl.
   *G01R 31/20* (2006.01)
(52) U.S. Cl.
   USPC ............... 324/754.03; 324/754.1; 324/755.01

(58) Field of Classification Search
   None
   See application file for complete search history.

(56) References Cited

U.S. PATENT DOCUMENTS

| | | | |
|---|---|---|---|
| 6,701,612 B2 * | 3/2004 | Khandros et al. | ............... 29/842 |
| 2010/0022104 A1 | 1/2010 | Osato et al. | |
| 2010/0289512 A1 * | 11/2010 | Kister | ...................... 324/750.16 |

FOREIGN PATENT DOCUMENTS

JP         2008-089555        4/2008

* cited by examiner

*Primary Examiner* — Melissa Koval
*Assistant Examiner* — Trung Nguyen
(74) *Attorney, Agent, or Firm* — Young & Thompson

(57) ABSTRACT

An electronic component contactor includes a plurality of contact pins, a housing that encases and determines positions of the plurality of contact pins, and a buffer member that buffers against the behavior of the contact pins. The contact pins each includes a base portion, a stretch portion that stretches from the base portion in an arc shape, a contact portion that is formed in the stretch portion, and a load receiving portion. The housing includes a support base in which a surface supporting the buffer member is formed to be flat. The buffer member is formed in a sheet-like shape. A portion of the buffer member that faces the load receiving portion is supported by the support base.

8 Claims, 7 Drawing Sheets

ELECTRONIC COMPONENT CONTACTOR, APPARATUS FOR TESTING ELECTRONIC COMPONENT, AND METHOD FOR TESTING ELECTRONIC COMPONENT

This application is based on Japanese patent application No. 2010-064426, the content of which is incorporated hereinto by reference.

BACKGROUND

1. Technical Field

The present invention relates to an electronic component contactor, an apparatus for testing an electronic component, and a method for testing an electronic component.

2. Related Art

When the electrical characteristics of a semiconductor device or other electronic components are tested, an electronic component contactor that relays an electrical connection between the electronic component and a test circuit board is used.

An example of the electronic component contactor is disclosed in Japanese Laid-Open Patent Publication No. 2008-089555. The electronic component contactor (an electric connection device) disclosed in Japanese Laid-Open Patent Publication No. 2008-089555 has a plurality of plate-shaped contact pins (contactors) that electrically connects conductive portions formed on a substrate to the terminals (electrodes) of the electronic component (test target object) and a housing in which the contact pins are arranged. In addition, the electronic component contactor disclosed in Japanese Laid-Open Patent Publication No. 2008-089555 has a buffer member (a rubber member) that is elastically deformed by the contact pins when the tip ends of the contact pins are pressed by the terminals of the electronic component.

SUMMARY

The present inventors have recognized as follows. In the technology disclosed in Japanese Laid-Open Patent Publication No. 2008-089555, the cross-section of the buffer member is formed in a circle shape, a square shape, a triangle shape, or the like. Accordingly, it is difficult to stably support the contact pins by using the buffer member. In addition, it is difficult to stabilize and uniformize the posture of each contact pin, and furthermore, to stabilize and uniformize a connection state between each contact pin and the terminals of the electronic component.

In a case where the cross-section of the buffer member has a circular shape, it is further difficult to stably support the contact pins by using the buffer member.

In addition, in a case where the cross-section of the buffer member has a square shape, a triangle shape, or the like, the buffer member may be twisted or rotated when the buffer member is deformed by the contact pins. Accordingly, it is furthermore difficult to stabilize and uniformize the posture of each contact pin and to stabilize and uniformize a connection state between each contact pin and the terminals of the electronic component.

As above, it is difficult to sufficiently stabilize and uniformize the posture of each contact pin of the electronic component contactor and furthermore, to sufficiently stabilize and uniformize the connection state between each contact pin and the terminals of the electronic component while the behavior of the contact pins is buffered by the buffer member.

In one embodiment, there is provided an electronic component contactor, including a plurality of contact pins that is connected to a plurality of wirings formed on a substrate and is brought into contact with a plurality of terminals of an electronic component, a housing that encases the plurality of contact pins and determines positions of the plurality of contact pins, and a buffer member that buffers against a behavior of the contact pins, wherein the contact pins each includes a base portion that is connected to the wiring, a stretch portion that stretches from the base portion in an arc shape, a contact portion that is formed in the stretch portion and is brought into contact with the terminal, and a load receiving portion that is formed in the stretch portion and faces the buffer member, and wherein the housing includes a support base in which at least a surface supporting the buffer member is formed to be flat and supports the buffer member, wherein the buffer member is formed in a sheet-like shape, and wherein at least a portion of the buffer member that faces the load receiving portion is supported by the support base.

According to this electronic component contactor, the sheet-shaped buffer member is disposed on the flat support base that is formed in the housing and faces the load receiving portion. In addition, at least a portion of the buffer member that faces the load receiving portion is supported by the support base. Accordingly, even when the buffer member is elastically deformed by being pushed by the load receiving portion, the buffer member can be stably supported by the support base, and the buffer member is not substantially twisted or rotated. Therefore, the posture of each contact pin of the electronic component contactor and furthermore, the connection state between each contact pin and the terminal of the electronic component can be sufficiently stabilized and uniformized while the behavior of the contact pins is buffered by the buffer member.

In another embodiment, there is provided an apparatus for testing an electronic component, including an electronic component contactor, and a test signal output unit, wherein the electronic contactor includes a plurality of contact pins that is connected to a plurality of wirings formed on a substrate and is brought into contact with a plurality of terminals of an electronic component, a housing that encases the plurality of contact pins and determines positions of the plurality of contact pins, and a buffer member that buffers against a behavior of the contact pins, wherein the contact pins each includes a base portion that is connected to the wiring, a stretch portion that stretches from the base portion in an arc shape, a contact portion that is formed in the stretch portion and is brought into contact with the terminal, and a load receiving portion that is formed in the stretch portion and faces the buffer member, wherein the housing including a support base in which at least a surface supporting the buffer member is formed to be flat and supports the buffer member, wherein the buffer member is formed in a sheet-like shape, wherein, at least a portion of the buffer member that faces the load receiving portion, is supported by the support base, wherein the test signal output unit outputs test signals to the predetermined contact pins out of the plurality of contact pins through the wirings, wherein the electronic component is tested by inputting test signals from the test signal output unit to the electronic component through the predetermined contact pins in a state in which the terminals of the electronic component are brought into contact with the corresponding contact pins.

In another embodiment, there is provided a method for testing an electronic component, including testing an electronic component by inputting test signals to the electronic component through predetermined contact pins out of a plurality of contact pins of an electronic component contactor, in which the electronic component contactor includes the plurality of contact pins that is connected to a plurality of wirings formed on a substrate and is brought into contact with a plurality of terminals of an electronic component, a housing that encases the plurality of contact pins and determines positions of the plurality of contact pins, and a buffer member that buffers against a behavior of the contact pins, in a state in which the plurality of terminals of the electronic component is brought into contact with the corresponding contact pins out of the plurality of contact pins, wherein the contact pins each includes a base portion that is connected to the wiring, a stretch portion that stretches from the base portion in an arc shape, a contact portion that is formed in the stretch portion and is brought into contact with the terminal, and a load receiving portion that is formed in the stretch portion and faces the buffer member, wherein the housing includes a support base in which at least a surface supporting the buffer member is formed to be flat and supports the buffer member, wherein the buffer member is formed in a sheet-like shape, and wherein at least a portion of the buffer member that faces the load receiving portion is supported by the support base.

According to the present invention, the posture of each contact pin of the electronic component contactor and furthermore, the connection state between each contact pin and the terminal of the electronic component can be sufficiently stabilized and uniformized while the behavior of the contact pins is buffered by the buffer member.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
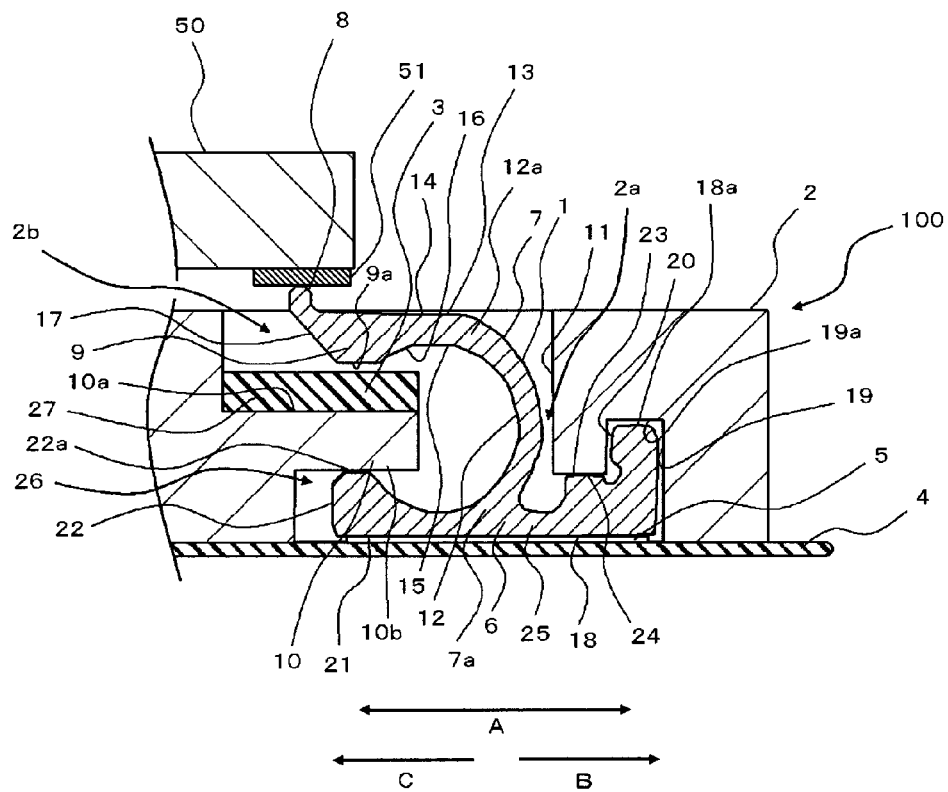
FIG. 1 is a side sectional view illustrating a main portion of an electronic component contactor according to an embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be explained below, referring to the attached drawings. Note that any similar constituents will be given the same reference numerals or symbols in all drawings, and explanations therefor will not be repeated.

Figure 2:
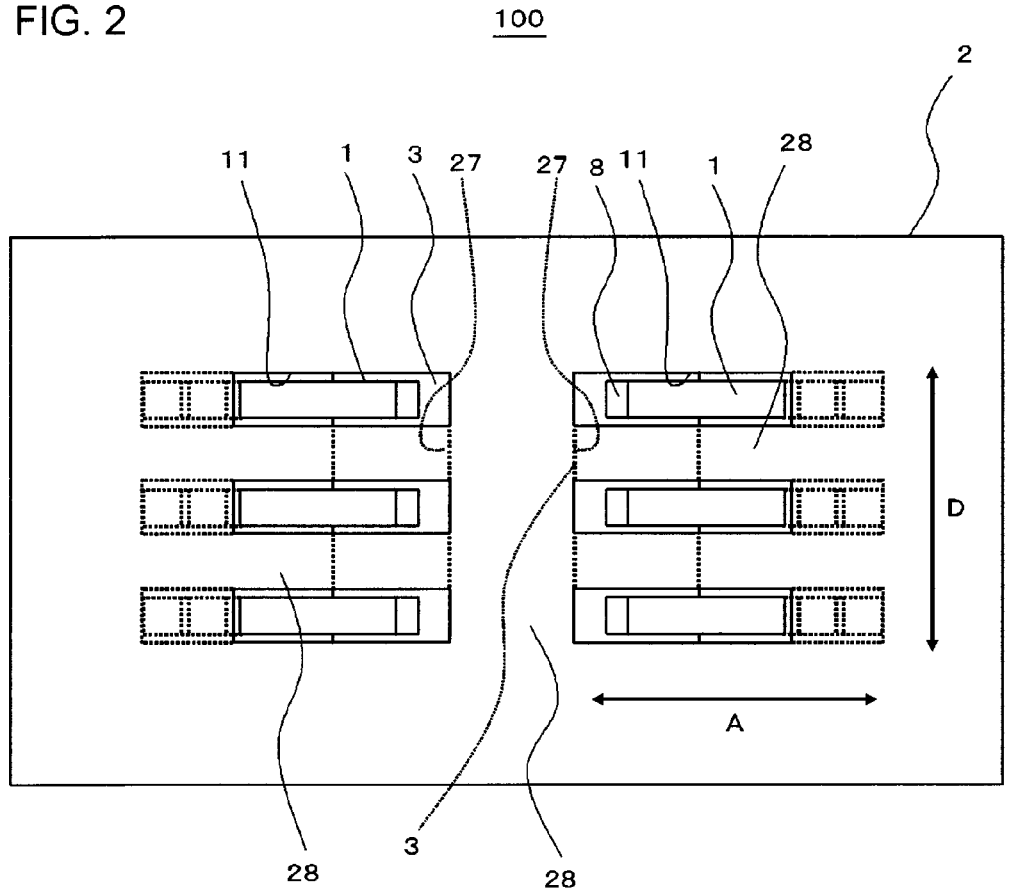
FIG. 2 is a plan view of an electronic component contactor according to an embodiment.
Figure 3:
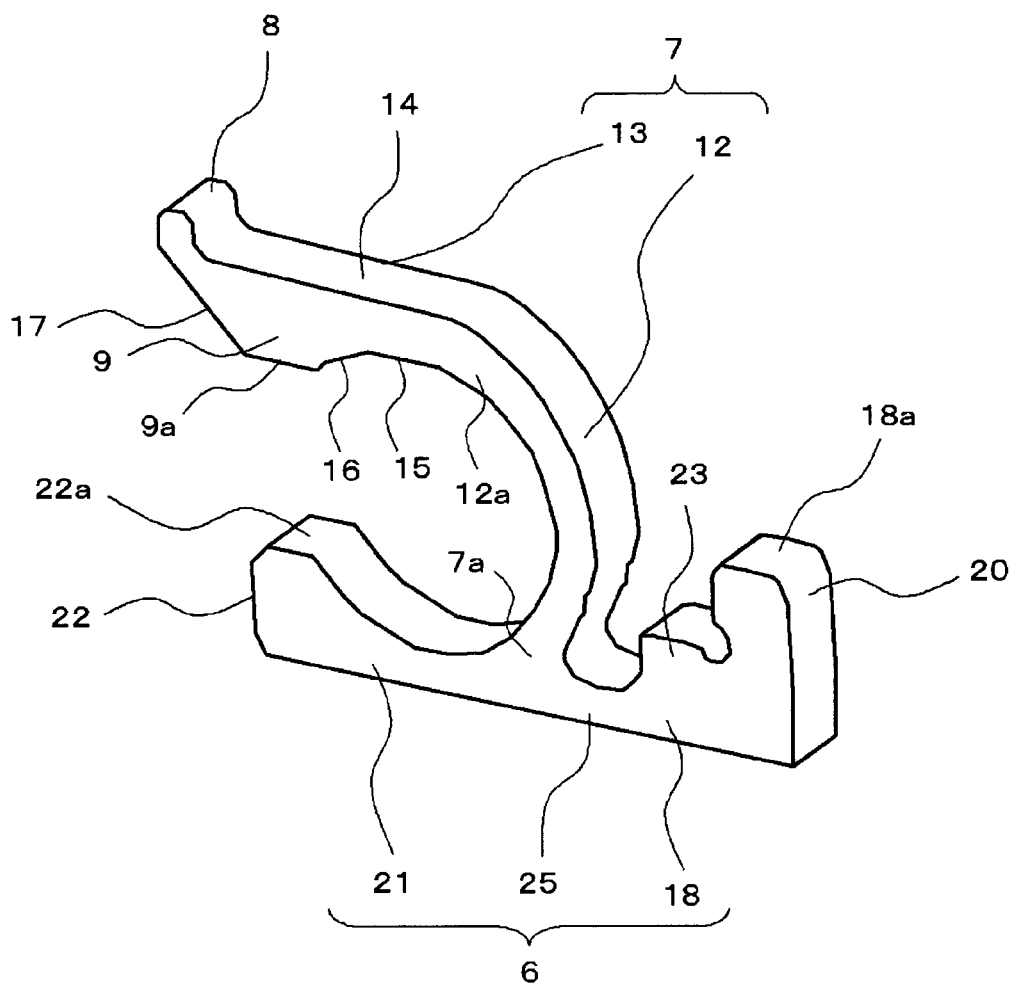
FIG. 3 is a perspective view of a contact pin.
Figure 4:
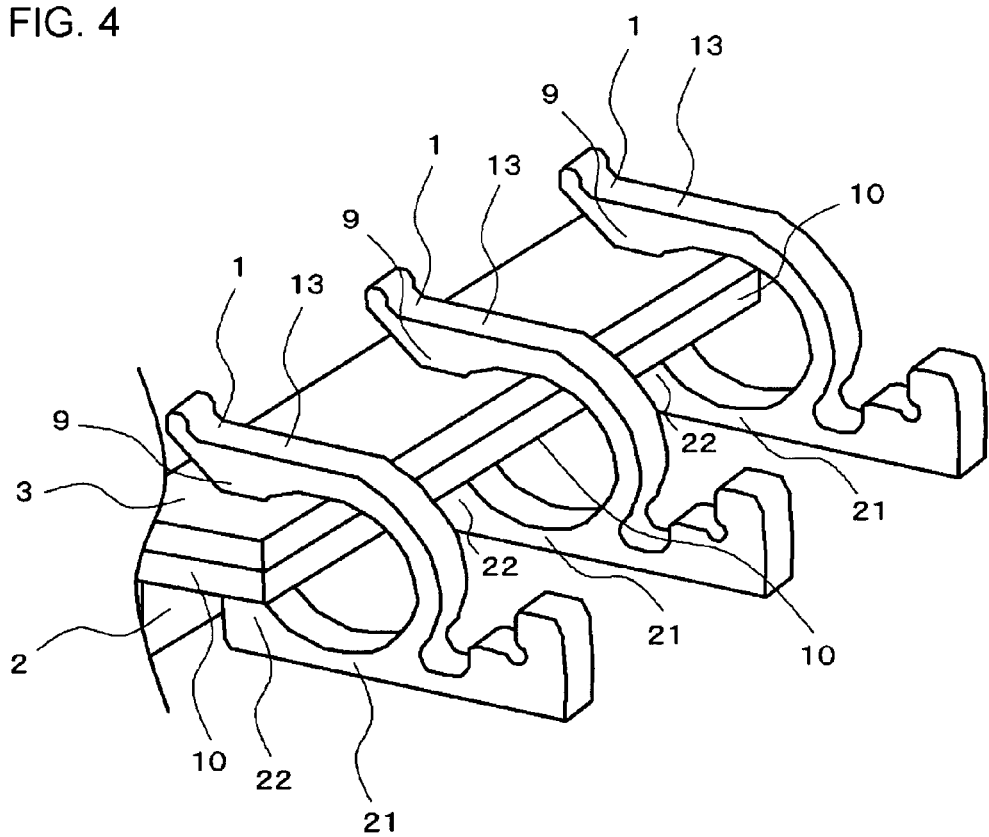
FIG. 4 is a perspective view illustrating the positional relationship among a contact pin, a buffer member, and a support base.
Figure 5:
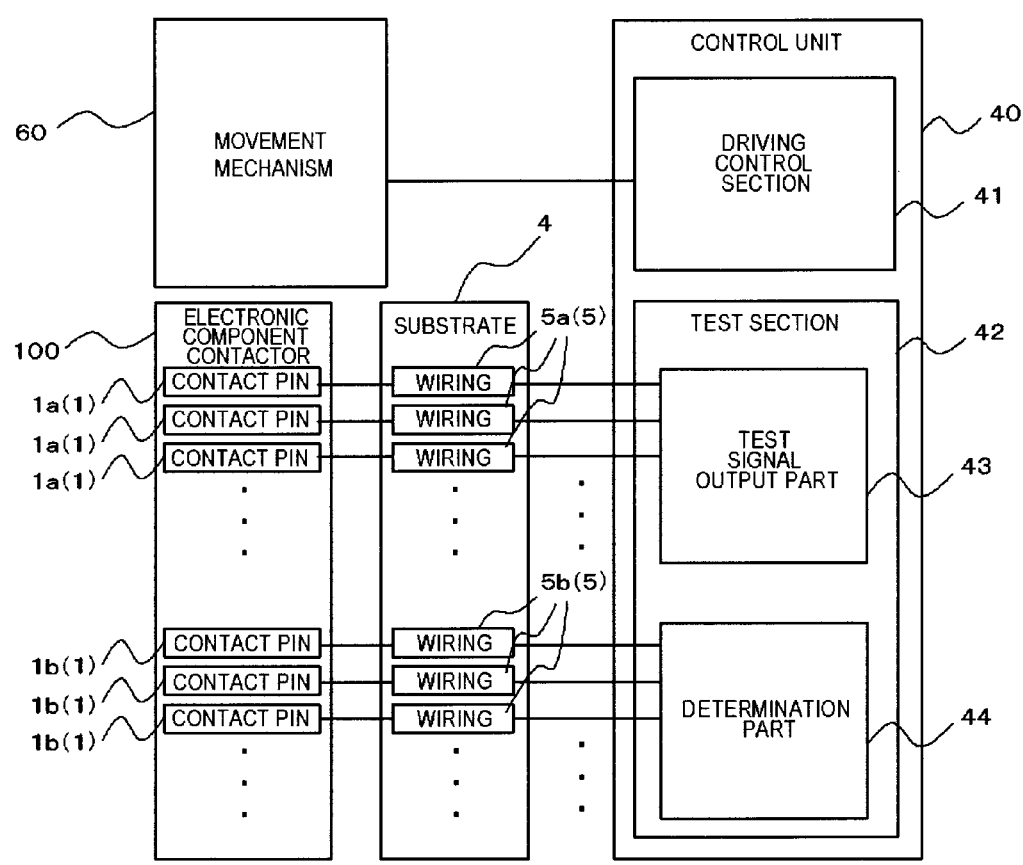
FIG. 5 is a block diagram illustrating an apparatus for testing an electronic component, according to an embodiment.

FIG. 1 is a side sectional view illustrating a main portion of an electronic component contactor 100 according to an embodiment, and FIG. 2 is a plan view of the electronic component contactor 100. In FIG. 2, a substrate 4 is not shown. FIG. 3 is a perspective view of a contact pin 1, and FIG. 4 is a perspective view illustrating the positional relationship among the contact pin 1, a buffer member 3, and a support base 10. FIG. 5 is a block diagram illustrating a test apparatus 150 for an electronic component, according to an embodiment.

The electronic component contactor 100 according to this embodiment includes a plurality of contact pins 1, a housing 2 that encases the plurality of contact pins 1 and determines the positions of the plurality of contact pins 1, and a buffer member 3 that buffers the behavior of the contact pins 1. Each of the plurality of the contact pins 1 is connected to a corresponding wiring 5 out of a plurality of wirings 5 formed on a substrate 4. The contact pin 1 is brought into contact with a corresponding terminal 51 out of a plurality of terminals 51 of an electronic component 50. The contact pin 1 is configured to include: a base portion 6 connected to the wiring 5; a stretch portion 7 that extends from the base portion 6 in an arc shape; a contact portion 8 that is formed in the stretch portion 7 and is brought into contact with the terminal 51; and a load receiving portion 9 that is formed in the stretch portion 7. The housing 2 has a support base 10 that supports the buffer member 3, and at least the surface 10a of the support base 10 that supports the buffer member 3 is formed to be flat. The buffer member 3 is formed in a sheet-like shape. This buffer member 3 is disposed on the support base 10 and faces the load receiving portion 9. At least the portion of the buffer member 3 that faces the load receiving portion 9 is supported by the support base 10. Hereinafter, the detailed description thereof will be followed.

As illustrated in FIG. 1, the housing 2, for example, is a structure body having an upper surface and a lower surface that are flat and parallel to each other (for example, a structure body having a rectangular parallelepiped shape or the like). The housing 2 is configured by an insulating material such as resin and is disposed on the substrate 4.

As illustrated in FIG. 2, a plurality of slits 11 is formed in the housing 2 (in the example illustrated in FIG. 2, a total of 6 slits are present, vertical three rows and horizontal two rows). In a practical application, for example, the slits 11 as much as the number of the terminals 51 of the electronic component 50 (for example, a semiconductor device) are formed. The slits 11 are partitioned from each other with a partition wall 28 of the housing 2. In each slit 11, one contact pin 1 is fixed. The slit 11 illustrated in FIG. 1 is one of the slits 11 disposed in the right row in FIG. 2. The shape of the slit 11 disposed in the left row in FIG. 2 is a shape acquired by horizontally reversing the slit 11 illustrated in FIG. 1. Inside each slit 11 disposed in the left row in FIG. 2, the contact pin 1 is arranged in the horizontally opposite direction of in FIG. 1.

As illustrated in FIG. 1, the slit 11 is open toward the upper and lower sides of the housing 2. The contact portion 8 of the contact pin 1 is brought into contact with the terminal 51 of the electronic component 50 through the upper opening of the slit 11. In addition, the bottom surface of the base portion 6 of the contact pin 1 is brought into contact with the wiring 5 on the substrate 4 through the lower opening of the slit 11. The base portion 6 is in the form of extending along the substrate 4. The direction of extension of the base portion 6 (the direction denoted by arrow A shown in FIG. 1) is the same as the direction of extension of the slit 11 (the direction denoted by arrow A shown in FIG. 2).

The contact pin 1 is configured by a material such as metal that has conductivity and elasticity. As the metal configuring the contact pin 1, for example, BeCu or phosphor bronze is preferably used. The contact pin 1 can be elastically deformed.

As illustrated in FIG. 3, the stretch portion 7, for example, stretches in an arc shape (for example, the shape of an 180° arc on the circumference of the center of an arc) with the center portion (the center portion in the direction of extension) of the base portion 6 being used as a base end portion 7a. The stretch portion 7, for example, includes a standing portion 12 that stands in an arc shape from the base end portion 7a and a tip-end side portion 13 that extends from a top portion 12a of the standing portion 12 to the tip end of the stretch portion 7.

In a tip end portion of the tip-end side portion 13, a contact portion 8 is formed. An upper surface 14 of a portion of the tip-end side portion 13 that excludes the contact portion 8, for example, is formed to be substantially flat and is arranged to be substantially horizontal. For example, this upper surface 14, as illustrated in FIG. 1, is substantially flushed with the upper surface of the housing 2. The contact portion 8 protrudes upwardly from the upper surface 14 and thus protrudes upwardly from the upper surface of the housing 2. In addition, part of the lower surface 15 of the tip-end side portion 13 is formed in an arc shape that is continuous from the standing portion 12.

The load receiving portion 9 is formed in the middle between the base end portion 7a of the stretch portion 7 and the contact portion 8. In detail, the load receiving portion 9 is formed in a portion of the tip-end side portion 13 that is disposed on the base end side from the contact portion 8. Normally, for example, a predetermined clearance is present between the load receiving portion 9 and the buffer member 3. Alternatively, the load receiving portion 9 may be normally brought into contact with the buffer member 3.

As illustrated in FIG. 1, the load receiving portion 9 has a flat surface 9a that faces the buffer member 3. A first adjacent portion 16 and a second adjacent portion 17 that are adjacent to both sides of the flat surface 9a in the stretch direction of the stretch portion 7 are positioned far from the buffer member 3 relative to the flat surface 9a. Described in detail, for example, a lower surface of the first adjacent portion 16 and a lower surface of the second adjacent portion 17 are inclined surfaces that are further spaced apart from the buffer member 3 as being positioned farther from the flat surface 9a. In addition, the second adjacent portion 17 is also adjacent to the contact portion 8.

The base portion 6 includes a first extension portion 18 that extends from the base end portion 7a of the stretch portion 7 to a side (the direction of arrow B shown in FIG. 1) opposite to the load receiving portion 9 side along the substrate 4. An end surface 18a of the first extension portion 18 that faces a side opposite to the substrate 4 is in proximity to the housing 2, for example, with a predetermined clearance.

In the housing 2, a concave portion 19 that opens toward the substrate 4 side is formed. The first extension portion 18 includes a protrusion 20 that protrudes toward a side opposite to the substrate 4 and intrudes into the concave portion 19. The protrusion 20 is intruded into the concave portion 19 with a predetermined clearance. The end face (that is, the end surface 18a) of the protrusion 20 that faces the side opposite to the substrate 4 is in proximity to the surface 19a of the concave portion 19 that faces the substrate 4 side with a predetermined clearance. The surface 19a is flat and is horizontally arranged. Here, the protrusion 20 may be fitted into the concave portion 19. The end surface 18a may be brought into contact with the surface 19a.

In addition, the base portion 6 has a pedestal portion 23 that is disposed at a level lower than the protrusion 20 between the protrusion 20 and the base end portion 7a, that is, on the load receiving portion 9 side from the protrusion 20. The top surface of the pedestal portion 23 is formed to be flat. On the other hand, the housing 2 has a surface 24 that is adjacent to the load receiving portion 9 side of the concave portion 19, flat, positioned on the substrate 4 side of the surface 19a, and horizontally arranged. For example, the top surface of the pedestal portion 23 is brought into contact with the surface 24.

In addition, the base portion 6 has a constricted portion 25 that has a height less than that of the pedestal portion 23 and has a constricted shape between the pedestal portion 23 and the base end portion 7a, that is, on the load receiving portion 9 side of the pedestal portion 23.

In addition, the base portion 6 includes a second extension portion 21 that extends from the base end portion 7a of the stretch portion 7 to the load receiving portion 9 side (the direction denoted by arrow C shown in FIG. 1) along the substrate 4. The second extension portion 21 includes an opposing portion 22 that faces the load receiving portion 9 through the support base 10 and the buffer member 3. The opposing portion 22 extends toward a position near the support base 10 and is raised higher than a portion of the second extension portion 21 other than the opposing portion 22. The end surface 22a of the opposing portion 22 that is disposed on the support base 10 side is formed to be flat, and the end surface 22a, for example, is brought into contact with the surface of the support base 10 that is disposed on the substrate 4 side.

In the above-described configuration, the contact pin 1 is fixed to the housing 2 in a posture in which the lower surface of the base portion 6 is parallel to the substrate 4 by bringing the end surface 22a thereof into contact with the lower surface of a protruded portion 10b of the housing 2, bringing the top surface of the pedestal portion 23 into contact with the surface 24 of the housing 2, and intruding the protrusion 20 into the concave portion 19.

In addition, for example, the entire bottom surface of the base portion 6 is formed to be flat.

Here, a part of the support base 10 forms the protruded portion 10b that protrudes from the main body of the housing 2 toward the inside of the slit 11. The protruded portion 10b is formed at a middle position between the upper surface and the lower surface of the housing 2 so as to protrude parallel to the substrate 4 from the inner wall of the main body of the housing 2. The bottom surface of the support base 10 is located at a position that is higher than those of the lower surface of the housing 2 and the opposing portion 22 of the contact pin 1. In addition, the upper surface of the buffer member 3 that is disposed on the support base 10 is located at a position that is lower than those of the upper surface of the housing 2 and the load receiving portion 9 of the contact pin 1. As shown in FIGS. 1 and 4, the support base 10 and a part of the buffer member 3 are inserted between the tip-end side portion 13 of the contact pin 1 and the second extension portion 21. A part of the second extension portion 21 including the tip end thereof is inserted into a space 26 between the support base 10 and the substrate 4.

A plurality of slits 11 aligned in a column (the direction of arrow D shown in FIG. 2) is partitioned from each other with the partition wall 28. However, the plurality of slits 11 aligned in the column communicates with each other through a communication hole 27 (FIGS. 1 and 2) having a size for which the buffer member 3 can pass through it at a position at which the buffer member 3 is arranged. The buffer member 3 is arranged over the plurality of slits 11 aligned in the column through the communication hole 27 and is used in common to a plurality of the contact pins 1 as illustrated in FIGS. 2 and 4. In FIG. 4, the partition wall 28 that partitions the plurality of slits 11 is not shown. However, actually, the partition wall 28 is arranged at the gap between the contact pins 1, and each support base 10 is integrally formed with the partition wall 28.

The buffer member 3, for example, is configured by an elastomer, resin having elasticity other than that, or the like. As described above, the buffer member 3 is formed in a sheet-like shape. Accordingly, the width (the size in the direction denoted by arrow A shown in FIG. 1) of the buffer member 3 is larger than the thickness thereof. The buffer member 3 is supported by the support base 10, for example, in the entire area in the widthwise direction thereof. In addition, the width of the buffer member 3, for example, is larger than that of the protruded portion 10b of the support base 10. It is preferable that the end surfaces of the buffer member 3 and the support base 10 in the direction denoted by arrow B shown in FIG. 1 form one surface.

The electronic component contactor 100 is configured as described above.

As above, the electronic component contactor 100 has a simple structure that is configured by three components including the contact pin 1, the buffer member 3, and the housing 2.

The electronic component contactor 100 can be assembled, for example, as described below. First, the buffer member 3 is disposed on the support base 10. Next, the contact pins 1 are fixed to a housing 2.

When the contact pin 1 is fixed, for example, first, the tip-end side portion 13 and the second extension portion 21 of the contact pin 1 are inserted through a lower opening of the slit 11. Next, the tip-end side portion 13 is passed through a space 2a formed between a protruded portion 10b, and an inner wall of the housing 2 that faces the protruded portion 10b and is intruded into a space 2b positioned on the upper side of the protruded portion 10b. Simultaneously, the contact pin 1 is fixed to the housing 2 by intruding the protrusion 20 into a concave portion 19.

Accordingly, the electronic component contactor 100 can be assembled easily.

Since the contact pin 1 is flat in the thickness direction, the contact pin 1 can be easily formed by etching a metal plate or performing press work for a metal plate.

An example of the electronic component 50 has been described as a semiconductor device. However, other electronic components may be used. The terminal 51 of the electronic component 50, for example, is a flat shape.

FIG. 5 is a block diagram illustrating the configuration of a test apparatus 150 for an electronic component (hereinafter, briefly referred to as a test apparatus 150), according to an embodiment.

This test apparatus 150 includes the above-described electronic component contactor 100 and a test signal output unit 43 that outputs a test signal to a predetermined contact pin 1a out of a plurality of contact pins 1 through a wiring 5 (particularly, a wiring 5a). The test apparatus 150 is configured so as to test an electronic component 50 by inputting a test signal to the electronic component 50 from the test signal output unit 43 through the predetermined contact pin 1a in the state in which the terminals 51 of the electronic component 50 (FIG. 1) are brought into contact with corresponding contact pins 1. Hereinafter, detailed description thereof will be followed.

As illustrated in FIG. 5, the test apparatus 150 includes a substrate 4 that is a circuit board for a test and the above-described electronic component contactor 100.

The substrate 4 has a plurality of wirings 5. By determining the position of the electronic component contactor 100 with respect to the substrate 4, the base portion 6 of each contact pin 1 is brought into contact with and electrically connected to a corresponding wiring 5. In addition, the contact portion 8 of each contact pin 1 is arranged at a position facing the terminal 51 of the electronic component 50. Accordingly, by determining the position of the electronic component 50 with respect to the electronic component contactor 100, each terminal 51 of the electronic component 50 can be brought into contact with the contact portion 8 of a corresponding contact pin 1 of the electronic component contactor 100.

The test apparatus 150 additionally includes a control unit 40 and a movement mechanism 60.

The control unit 40 is configured to include a driving control section 41 that controls the operation of the movement mechanism 60 and a test section 42 that tests an electronic component 50.

The test section 42 is configured to include a test signal output part 43 and a determination part 44.

The test signal output part 43 outputs predetermined test signals to predetermined wirings 5a out of a plurality of wirings 5 of the substrate 4. These test signals are input to predetermined terminals 51 of the electronic component 50 through predetermined contact pins 1a that are brought into contact with the predetermined wirings 5a out of a plurality of contact pins 1 of the electronic component contactor 100.

To the determination part 44, test result signals are input from predetermined wirings 5b other than the wirings, to which the test signals are input, out of the plurality of wirings 5 of the substrate 4. In other words, the predetermined terminals 51 other than the terminals, with which the contact pins 1a are brought into contact, out of the terminals 51 of the electronic component 50 output test result signals in accordance with test signals. These test result signals are input to the determination part 44 through predetermined contact pins 1b, with which the other predetermined terminals 51 are brought into contact, and predetermined wirings 5b with which the predetermined contact pins 1b are brought into contact with. The determination part 44 tests the electronic component 50 based on the test result signals.

The movement mechanism 60 includes a holding mechanism (not shown in the figure) that holds the electronic component 50. The detailed description of the holding mechanism will be omitted. This movement mechanism 60 brings the terminals 51 of the electronic component 50 into contact with the contact portions 8 of corresponding contact pins 1 by moving (for example, lowering) the electronic component 50 held by the holding mechanism to the electronic component contactor 100 side under the control of the driving control section 41 (see FIG. 1).

Next, the operation will be described.

A method for testing an electronic component according to this embodiment includes a process of testing an electronic component 50 by inputting test signals to the electronic component 50 through predetermined contact pins 1 out of a plurality of contact pins 1 in the state in which a plurality of terminals 51 of the electronic component 50 is brought into contact with corresponding contact pins 1 out of contact pins 1 of the above-described electronic component contactor 100. Hereinafter, the method will be described in detail.

First, an electronic component contactor 100 in which contact pins 1 are built is assembled with being positioned with respect to a substrate 4 having wirings 5. Accordingly, the base portion 6 of each contact pin 1 is electrically connected to a corresponding wiring 5.

Next, the electronic component 50 is held by a movement mechanism 60, and the electronic component 50 is lowered by the movement mechanism 60. By lowering the electronic component 50, the terminals 51 of the electronic component 50 are brought into contact with the contact portions 8 of corresponding contact pins 1, and accordingly, the terminals 51 are electrically connected to the corresponding contact pins 1.

Here, the operation of bringing the terminals 51 into contact with the contact portions 8 of the contact pins 1 will be described in detail.

When the terminal 51 and the contact portion 8 are brought into contact with each other, the contact pin 1 (mainly the stretch portion 7) is bent by being elastically transformed as the contact portion 8 is pushed by the terminal 51. When the contact pin 1 is bent as above, the load receiving portion 9 is moved to a buffer member 3 side so as to be brought into contact with the buffer member 3. Then, the buffer member 3 is elastically deformed by being pushed by the load receiving portion 9 (a pushed portion is caved in). Accordingly, the behavior of the contact pin 1 is buffered by the buffer member 3. Therefore, the amount of bending of the contact pin 1 can be suppressed. In addition, the terminal 51 is in the state of being elastically pressed by the contact portion 8 due to the elasticity of the contact pin 1.

Here, in the electronic component contactor 100, a sheet-shaped buffer member 3 (thus, having a flat upper surface) is disposed on a flat support base 10 formed in the housing 2 and faces the load receiving portion 9. In addition, at least a portion of the buffer member 3 that faces the load receiving portion 9 is supported by the support base 10. Accordingly, even when the buffer member 3 is elastically deformed by being pushed by the load receiving portion 9, the buffer member 3 can be stably supported by the support base 10. In addition, the twist or rotation (the rotation of the buffer member 3 about a longitudinal axis (the direction of arrow D shown in FIG. 2) as its center) of the buffer member 3 does not substantially occur. Accordingly, the posture of each contact pin 1 of the electronic component contactor 100 can be sufficiently stabilized and uniformized while the behavior of the contact pin 1 is buffered by the buffer member 3, and, furthermore, the connection state between each contact pin 1 and the terminal 51 can be sufficiently stabilized and uniformized.

In addition, for example, in a case where the cross section of the buffer member 3 has a square shape, a triangle shape, or the like, the buffer member 3 is twisted or rotated (rolled), and the buffer member 3 is unstable, compared to the case in which the buffer member 3 has a sheet-like shape. As a result, the variation in the postures of the contact pins 1 is large, and it is difficult that the contact between each contact pin 1 and the terminal 51 to be uniform. Therefore, it is difficult to perform an appropriate test (measurement).

In addition, in a case where the upper surface of the buffer member 3 has a curved shape such as a case where the cross section of the buffer member 3 has a circular shape, the amount of burial of the contact pin 1 is relatively large, compared to a case where the upper surface is flat. As a result, the variation in the postures of the contact pins 1 is large, and it is difficult for the contact between each contact pin 1 and the terminal 51 to be uniform. Therefore, it is difficult to perform an appropriate test.

In addition, in a case where a string-shaped rubber member as in Japanese Laid-Open Patent Publication No. 2008-089555 is used for buffering the contact pins, the rubber member may shear due to a pressing force applied from the contact pins. To the contrary to this, according to this embodiment, since the buffer member 3 has a sheet-like shape, it is difficult for the buffer member 3 to shear, compared to the case of the buffer member having a string shape.

As above, after the terminals 51 are brought into contact with the contact portions 8, by outputting test signals from the test signal output part 43, the electronic component 50 can be tested. In other words, predetermined test signals are output from the test signal output part 43 to predetermined contact pins 1a of the electronic component contactor 100 though predetermined wirings 5a. Then, the test signals are input from the predetermined contact pins 1a to corresponding terminals 51. On the other hand, test result signals are input from corresponding terminals 51 to predetermined contact pins 1b other than the contact pins, to which the test signals are input, out of the contact pins 1 of the electronic component contactor 100. These test result signals are input to the determination part 44 from the contact pins 1b through corresponding wirings 5b. The determination part 44 performs a test (a quality test or the like) for the electronic component 50 based on the test result signals.

After the test is performed, the terminals 51 are separated from the contact portions 8 by raising the electronic component 50 by using the movement mechanism 60.

According to the first embodiment as above, the sheet-shaped buffer member 3 is disposed on the flat support base 10 and faces the load receiving portion 9, and at least a part of the buffer member 3 that faces the load receiving portion 9 is supported by the support base 10. Thus, even when the buffer member 3 is elastically deformed by being pushed by the load receiving portion 9, the buffer member 3 can be stably supported by the support base 10. In addition, the twist or rotation of the buffer member 3 does not substantially occur. Therefore, the posture of each contact pin 1 of the electronic component contactor 100 and furthermore the connection state between each contact pin 1 and the terminal 51 can be sufficiently stabilized and uniformized while the behavior of the contact pin 1 is buffered by the buffer member 3.

In addition, by buffering the behavior of the contact pins 1 using the buffer member 3, the amount of bending of the contact pins 1 can be suppressed. Thus, even when the length of the contact pins 1 is shortened, and the limit of the amount of bending of the contact pins 1 at which the contact pins 1 are damaged is decreased, by complementing the resistance for an impact load or an excessive load and absorbing the impact load or the excessive load, using the elasticity of the buffer member 3, the amount of bending of the contact pins 1 can be adjusted. Accordingly, it is possible to improve the durability by suppressing damage of the contact pins 1. As a result, an electronic component contactor 100 that includes contact pins 1 having a short length and has superior electrical characteristics can be realized.

In addition, since a structure is employed in which each contact pin 1 is configured as one component, and the contact pins 1 are directly built in the housing 2, an operation of assembling the electronic component contactor 100 can be simplified.

Furthermore, since the structure is employed in which each contact pin 1 configured as one component is directly built in the housing 2, a gap between adjacent contact pins 1 can be narrowed, and accordingly, the electronic component contactor 100 can be easily applied to a narrow-pitch semiconductor device.

In addition, for example, in a case where a configuration is employed in which the contact pin is configured by a plurality of members and the plurality of members is slid with each other, scraps generated due to friction at the time of contacts may be clogged in a sliding portion so as to deteriorate the slidability. In contrast to this, according to this embodiment, since each contact pin 1 is configured as one component, such a problem does not occur, and the characteristics of the electronic component 50 can be measured in a stable manner.

In addition, since the first and second adjacent portions 16 and 17 that are adjacent to the flat surface 9a are positioned farther from the buffer member 3 than the flat surface 9a of the load receiving portion 9, the flat surface 9a can be easily brought into contact with the buffer member 3, and the buffering action can be sufficiently acquired.

In addition, the base portion 6 includes the first extension portion 18 that extends along the substrate 4 from the base end portion 7a of the stretch portion 7 to the side opposite to the load receiving portion 9 side, and the end surface 18a of the first extension portion 18 that faces the side opposite to the substrate 4 is in proximity to or in contact with the housing 2. Thus, even when the contact portion 8 receives a load from the terminal 51, the first extension portion 18 can be suppressed from floating from the substrate 4 with the base end portion 7a used as a supporting point. Accordingly, the posture of each contact pin 1 can be stabilized and uniformized further.

In particular, the concave portion 19 that is open toward the substrate 4 side is formed in the housing 2, and the first extension portion 18 includes the protrusion 20 that protrudes toward the side opposite to the substrate 4 and is intruded into the concave portion 19 is included. Since the end surface 18a of the protrusion 20 that faces the side opposite to the substrate 4 is in proximity to or in contact with the surface 19a of the concave portion 19 that faces the substrate side, the variation in the position of the protrusion 20 can be suppressed by the concave portion 19. Accordingly, the posture of each contact pin 1 can be stabilized and uniformized further. In addition, by employing a structure in which the protrusion 20 is fitted into the concave portion 19, the contact pin 1 can be fixed to the housing 2 by using the protrusion 20, and accordingly, the contact pin 1 or the buffer member 3 can be easily exchanged. Therefore, the maintenance of the electronic component contactor 100 can be performed easily.

In addition, the base portion 6 includes the second extension portion 21 that extends from the base end portion 7a of the stretch portion 7 to the load receiving portion 9 side along the substrate 4. The second extension portion 21 includes the opposing portion 22 that faces the load receiving portion 9 through the support base 10 and the buffer member 3. The opposing portion 22 is raised toward a position near the support base 10, and the end surface 22a of the opposing portion 22 that is located on the support base 10 side is formed to be flat. Thus, even when the support base 10 is bent due to a load received from the terminal 51, the lower limit of the support base 10 can be maintained by the opposing portion 22. Accordingly, the displacement of the support base 10, and furthermore, the displacement of the load receiving portion 9 can be suppressed.

Modification

Figure 6:
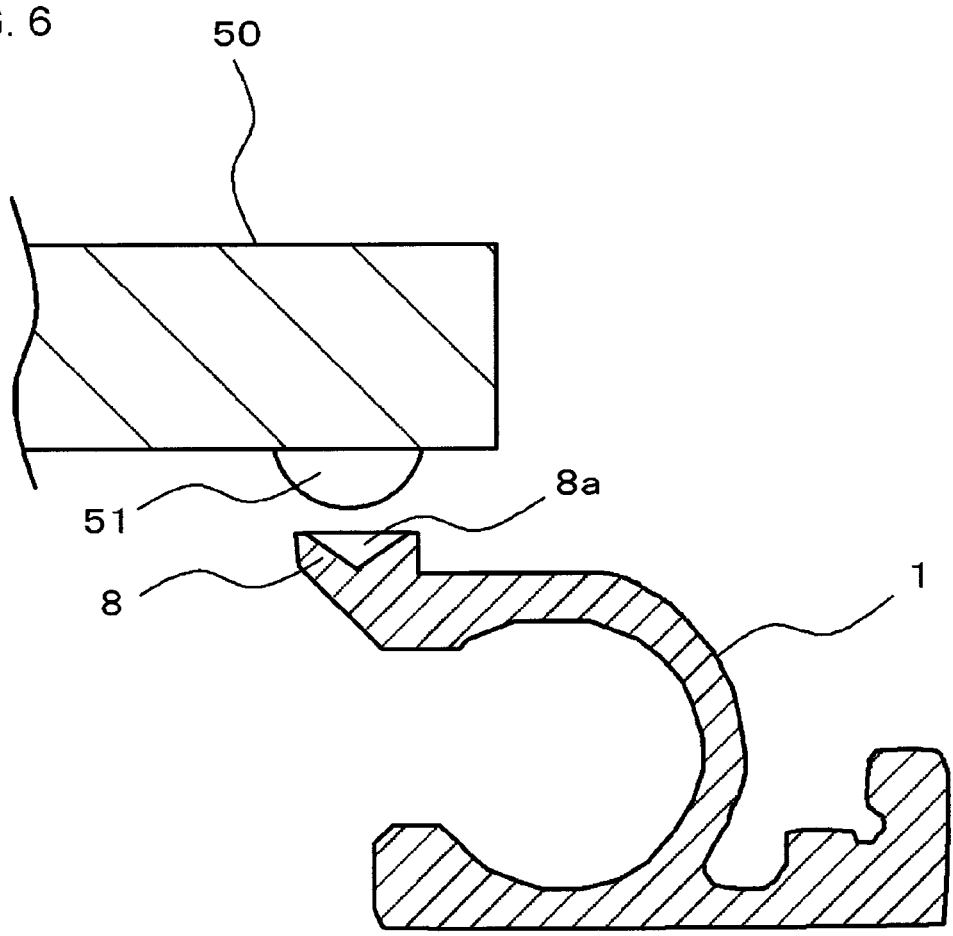
FIG. 6 is a side sectional view of a contact pin according to a modification.
Figure 7:
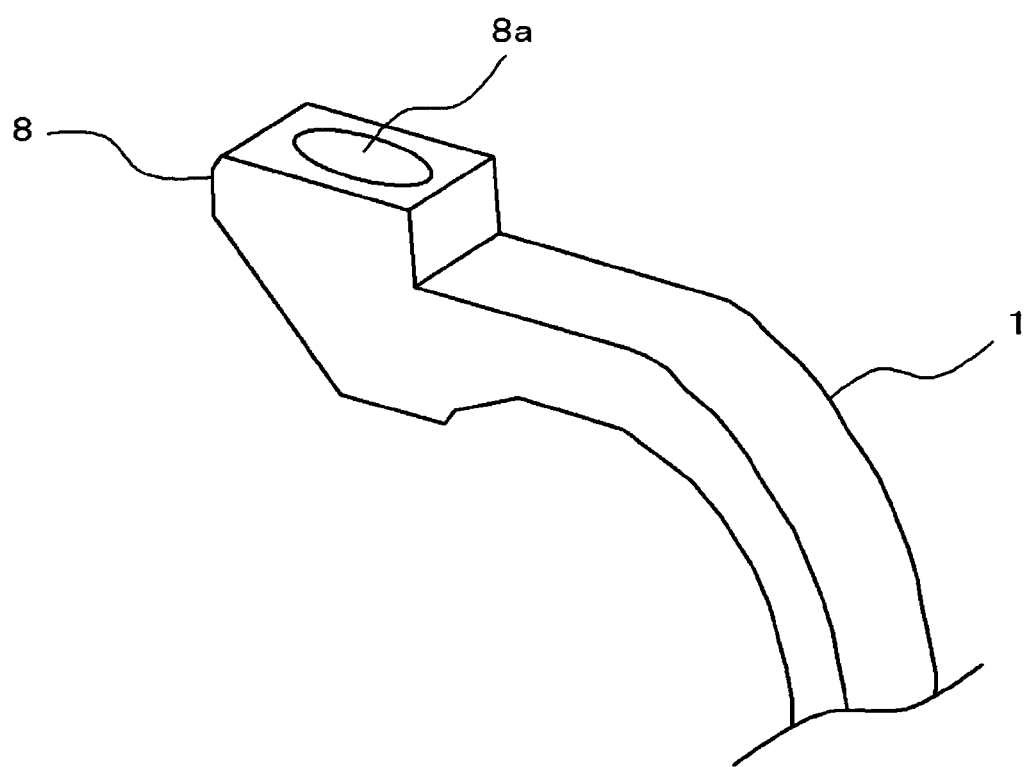
FIG. 7 is a perspective view of a contact pin according to the modification.

FIG. 6 is a side sectional view of a contact pin 1 according to a modification, and FIG. 7 is a perspective view of the contact pin 1 according to the modification.

As illustrated in FIG. 6, the terminal 51 of the electronic component 50 may have a shape having a convex curved surface such as a hemisphere shape. Examples of such a terminal 51 include a ball grid array (BGA). In such a case, as illustrated in FIGS. 6 and 7, a concave portion 8a into which at least a part of the convex curved surface of the terminal 51 is intruded may be formed in the contact portion 8 of the contact pin 1. For example, the concave portion 8a is formed in a cone shape. Thus, even when the terminal 51 is brought into contact with the contact portion 8, it is difficult for the tip end of the terminal 51 to be brought into contact with the concave portion 8a, and the tip end of the terminal 51 is suppressed from being crushed.

In addition, in the above-described embodiment, an example has been described in which the terminal 51 is brought into contact with the contact portion 8 by moving (for example, lowering) the electronic component 50 to the electronic component contactor 100 side using the movement mechanism 60. However, the terminal 51 may be brought into contact with the contact portion 8 by relatively moving the electronic component 50 and the electronic component contactor 100. In other words, the movement mechanism 60 may bring the terminal 51 into contact with the contact portion 8 by moving (for example, lifting up) the electronic component contactor 100 and the substrate 4 to the electronic component 50 side. Alternatively, the movement mechanism 60 may bring the terminal 51 into contact with the contact portion 8 by moving the electronic component 50 to the electronic component contactor 100 side while moving the electronic component contactor 100 to the electronic component 50 side.

It is apparent that the present invention is not limited tot the above embodiments, and may be modified and changed without departing from the scope and spirit of the invention.

What is claimed is:

1. An electronic component contactor, comprising:
   a plurality of contact pins that is connected to a plurality of wirings formed on a substrate and is brought into contact with a plurality of terminals of an electronic component;
   a housing that encases said plurality of contact pins and determines positions of said plurality of contact pins; and
   a buffer member that buffers against a behavior of said contact pins,
   wherein said contact pins each includes:
   a base portion that is connected to said wiring;
   a stretch portion that stretches from said base portion in an arc shape;
   a contact portion that is formed in said stretch portion and is brought into contact with said terminal; and
   a load receiving portion that is formed in said stretch portion and faces said buffer member, and
   wherein said housing includes a support base in which at least a surface supporting said buffer member is formed to be flat and supports said buffer member,
   wherein said buffer member is formed in a sheet-like shape, and
   wherein at least a portion of said buffer member that faces said load receiving portion is supported by said support base.

2. The electronic component contactor according to claim 1,
   wherein said load receiving portion is formed in a midway portion between a base end portion of said stretch portion and said contact portion,
   wherein said load receiving portion includes a flat surface that faces said buffer member, and
   wherein first and second adjacent portions that are adjacent to both sides of said flat surface in a stretch direction of said stretch portion are positioned farther from said buffer member than said flat surface.

3. The electronic component contactor according to claim 1,
   wherein said base portion includes a first extension portion that extends from a base end portion of said stretch portion to a side opposite to said load receiving portion along said substrate, and wherein an end surface of said first extension portion that faces a side opposite to said substrate is in close proximity to or in contact with said housing.

4. The electronic component contactor according to claim 3,
wherein an concave portion that is open toward said substrate side is formed in said housing,
wherein said first extension portion includes a protrusion that protrudes toward a side opposite to said substrate and intrudes into said concave portion, and
wherein an end surface of said protrusion that faces a side opposite to said substrate is in close proximity to or in contact with a surface of said concave portion that faces said substrate side.

5. The electronic component contactor according to claim 1,
wherein said base portion includes a second extension portion that extends, along said substrate, from a base end portion of said stretch portion to said load receiving portion side,
wherein said second extension portion includes an opposing portion that faces said load receiving portion through said support base and said buffer member, and
wherein said opposing portion is raised toward a position near said support base, and an end surface of said opposing portion that is located on said support base side is formed to be flat.

6. The electronic component contactor according to claim 1,
wherein said terminal includes a convex curved surface, and
wherein a concave portion into which at least part of said convex curved surface intrudes is formed in said contact portion.

7. An apparatus for testing an electronic component, the apparatus, comprising:
an electronic component contactor; and
a test signal output unit,
wherein said electronic contactor includes:
a plurality of contact pins that is connected to a plurality of wirings formed on a substrate and is brought into contact with a plurality of terminals of an electronic component;
a housing that encases said plurality of contact pins and determines positions of said plurality of contact pins; and
a buffer member that buffers against a behavior of said contact pins,
wherein said contact pins each includes:
a base portion that is connected to said wiring;
a stretch portion that stretches from said base portion in an arc shape;
a contact portion that is formed in said stretch portion and is brought into contact with said terminal; and
a load receiving portion that is formed in said stretch portion and faces said buffer member,
wherein said housing including a support base in which at least a surface supporting said buffer member is formed to be flat and supports said buffer member,
wherein said buffer member is formed in a sheet-like shape,
wherein at least a portion of said buffer member that faces said load receiving portion is supported by said support base,
wherein the test signal output unit outputs test signals to the predetermined contact pins out of said plurality of contact pins through said wirings,
wherein said electronic component is tested by inputting test signals from said test signal output unit to said electronic component through said predetermined contact pins in a state in which said terminals of said electronic component are brought into contact with said corresponding contact pins.

8. A method for testing an electronic component, the method comprising:
testing an electronic component by inputting test signals to said electronic component through predetermined contact pins out of a plurality of contact pins of an electronic component contactor, in which said electronic component contactor includes said plurality of contact pins that is connected to a plurality of wirings formed on a substrate and is brought into contact with a plurality of terminals of an electronic component, a housing that encases said plurality of contact pins and determines positions of said plurality of contact pins, and a buffer member that buffers against a behavior of said contact pins, in a state in which said plurality of terminals of said electronic component is brought into contact with said corresponding contact pins out of said plurality of contact pins,
wherein said contact pins each includes:
a base portion that is connected to said wiring;
a stretch portion that stretches from said base portion in an arc shape;
a contact portion that is formed in said stretch portion and is brought into contact with said terminal; and
a load receiving portion that is formed in said stretch portion and faces said buffer member,
wherein said housing includes a support base in which at least a surface supporting said buffer member is formed to be flat and supports said buffer member,
wherein said buffer member is formed in a sheet-like shape, and
wherein at least a portion of said buffer member that faces said load receiving portion is supported by said support base.

* * * * *